(12) United States Patent
Lewis et al.

(10) Patent No.: US 7,633,220 B2
(45) Date of Patent: Dec. 15, 2009

(54) OPTOELECTRONIC DEVICES WITH MULTILAYERED STRUCTURES

(75) Inventors: Larry Neil Lewis, Scotia, NY (US); James Anthony Cella, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 426 days.

(21) Appl. No.: 11/610,784

(22) Filed: Dec. 14, 2006

(65) Prior Publication Data

US 2007/0225454 A1    Sep. 27, 2007

Related U.S. Application Data

(60) Provisional application No. 60/784,750, filed on Mar. 22, 2006.

(51) Int. Cl.
*C08G 61/02* (2006.01)

(52) U.S. Cl. .................... 313/504; 525/479; 528/25; 528/31; 528/397

(58) Field of Classification Search .................. None
See application file for complete search history.

(56) References Cited

U.S. PATENT DOCUMENTS

| | | | |
|---|---|---|---|
| 5,300,575 A | 4/1994 | Jonas et al. | |
| 5,708,130 A | 1/1998 | Woo et al. | |
| 6,169,163 B1 | 1/2001 | Woo et al. | |
| 6,255,449 B1 | 7/2001 | Woo et al. | |
| 6,512,083 B1 | 1/2003 | Woo et al. | |
| 6,517,958 B1 | 2/2003 | Sellinger et al. | |
| 6,555,682 B1 | 4/2003 | Kannan et al. | |
| 6,900,285 B2 | 5/2005 | Woo et al. | |
| 6,903,505 B2 | 6/2005 | McNulty et al. | |
| 7,071,289 B2 | 7/2006 | Sotzing | |
| 2003/0154647 A1 | 8/2003 | Nguyen et al. | |
| 2003/0208032 A1 | 11/2003 | Woo et al. | |
| 2004/0034187 A1* | 2/2004 | Arai et al. ................. | 528/87 |
| 2004/0192871 A1 | 9/2004 | Wang et al. | |
| 2005/0123760 A1* | 6/2005 | Cammack et al. ............ | 428/403 |
| 2005/0176915 A1 | 8/2005 | Cho et al. | |
| 2005/0186106 A1 | 8/2005 | Li et al. | |
| 2006/0163562 A1 | 7/2006 | Boerner | |

FOREIGN PATENT DOCUMENTS

| | | |
|---|---|---|
| FR | 1323062 A | 4/1963 |
| JP | 2007023252 A | 2/2007 |

OTHER PUBLICATIONS

"Synthesis & Characterization of New Two-Photon Absorbing Polymers", Kevin D. Belfield et al., ACS Polymer Preprints, 1999, V. 40, pp. 127-128.

"Reactions of 9-Substituted Fluorenide Carbanions with Allyl Chlorides by $S_N2$ and $S_N2'$ Mechanisms", Frederick G. Bordwell, et al., J. Amer. Chem. Society, 1987, 109, pp. 1773-1782.

Brizius et al., "Alkyne Metathesis With Simple Catalyst Systems: Efficient Synthesis of Conjugated Polymers Containing Vinyl Groups in Main or Side Chain", J. Am. Chem. Soc., vol. 122, No. 50, pp. 12435-12440, Dec. 2, 2000.

Kelley et al., "The Synthesis of Bridged Oligophenylenes From Fluorene 1. Terphenyls and Quaterphenyls", J. Chem. Res. Miniprint, vol. 12, pp. 2701-2733, 1997.

PCT International Search Report dated Oct. 2, 2007.

PCT International Search Report dated Nov. 27, 2007.

Advincuia et al., "Electro-Deposition and Patterning Ultrathin Films of Conjugated Polymers on Flat Conducting Surfaces: The Precursor Polymer and Grafting Approach for Electro-Optical Applications", Polymer Preprints, vol. 42, No. 2, pp. 573-574, 2001, XP009092088.

Cho et al., "Synthesis and Characterization of Thermally Stable Blue Light-Emitting Polyfluorenes Containing Siloxane Bridges", Macromolecules, , vol. 36, pp. 6704-6710, 2003, XP009092076.

Pu et al., Synthesis, Morphology and Photophysics of Novel Hybrid Organic-Inorganic Polyhedral Oligomeric Silsesquioxane-Tethered Poly(fluorenyleneethynylene)s, Polymer, vol. 47, No. 6, pp. 1970-1978, Mar. 8, 2006.

Chua et al., "General Observation of n-type Field-Effect Behaviour in Organic Semiconductors", Nature, vol. 434, No. 7030, pp. 194-199, Mar. 10, 2005, XP002327479.

Hofmann et al., "Integrated Optical Detection for Microfluidic Systems Using Thin-Film Polymer Light Emitting Diodes and Organic Photodiodes", Micro Total Analysis Systems, vol. 2, pp. 506-508, Sep. 26-30, 2004, XP009092083.

* cited by examiner

*Primary Examiner*—Marc S Zimmer
(74) *Attorney, Agent, or Firm*—Mary Louise Gioeni

(57) ABSTRACT

Optoelectronic devices include a polymer composition derived from reaction between a hydrosiloxane and a polyfluorene comprising structural units of formula I

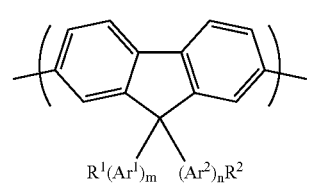

wherein
 $R^1$ and $R^2$ are independently alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;
 $Ar^1$ and $Ar^2$ are independently aryl or substituted aryl;
 m and n are independently 0 or 1; and
 at least one of $R^1$ and $R^2$ is alkenyl, alkynyl, substituted alkenyl, or substituted alkynyl.

22 Claims, No Drawings

OPTOELECTRONIC DEVICES WITH MULTILAYERED STRUCTURES

CROSS REFERENCE TO RELATED APPLICATIONS

This application is a non-provisional of and claims priority from U.S. provisional application Ser. No. 60/784,750, filed Mar. 22, 2006, which is incorporated herein by reference, and is related to US patent application entitled "OPTOELECTRONIC DEVICES WITH MULTILAYERED STRUCTURES", filed on even date herewith, which is incorporated herein by reference.

BACKGROUND

Organic light emitting diodes (OLEDs) are multi-layer optoelectronic devices. The current commercial applications for OLEDs are primarily used for display applications and are composed of small molecules as the active materials. Manufacture of the small-molecule-based OLEDs relies heavily on vapor deposition processes. The next big application space for OLEDs is general lighting. In order to meet the large volume/low cost requirements for general lighting, low cost manufacturing like a roll-to-roll, newspaper-like printing process is needed. Such roll-to-roll manufacturing employs solvent-based processes and thus small-molecules are replaced by good film-forming polymers. Processes that use successive solvent-based deposition steps suffer from the potential problem that the solvent used to apply layer two will remove polymer layer one.

The first polymer based OLEDs were simple three-layer devices, limited to a cathode, an anode and an emissive layer, so as to minimize the issue of polymer removal by solvent. Naturally there has been a need to improve device performance thus necessitating the need for additional layers in the OLED.

The requirement for additional layers has led back to the problem of removal of underlying layers; wherein all layers are solvent-deposited. Two basic strategies have been applied to enable solvent-based deposition of multiple polymer layers. One can design a device where subsequent layers are deposited by solvents that do not remove the underlying layer. The prototypical example is that where the hole injection layer composed of poly(styrenesulphonate-doped poly(3,4-ethylenedioxythiophene) (PEDOT:PSS) is applied from water, the subsequent light emitting layer like 9,9-di-substituted polyfluorene, is deposited from solvents like xylenes; PDOT:PSS is not removed by xylenes. A second strategy for preparation of OLEDs with multiple layers deposited by solvents is to render each layer insoluble prior to application of the next layer. The second strategy can be divided into two types. A solvent soluble layer can be combined with a cross-linkable monomer like an acrylate. The desired layer and monomer is then subjected to conditions that cross-link the monomer, typically UV-irradiation. The result of the irradiation of the polymer layer and acrylate monomer is formation of an interpenetrating layer, rendering the solvent-deposited layer insoluble. A more elegant way to render a solvent-deposited layer insoluble is to custom-synthesize the layer of choice so that it contains a cross-linkable site; no added monomers are necessary. After deposition of the solvent-deposited layer, heat or light renders the layer insoluble.

However, there remains a need for methods and compositions that can render solvent-deposited layers insoluble for later deposition steps.

DETAILED DESCRIPTION

In one aspect, the present invention relates to hybrid organic-inorganic polymer compositions derived from reaction between a hydrosiloxane and a polyfluorene comprising structural units of formula I

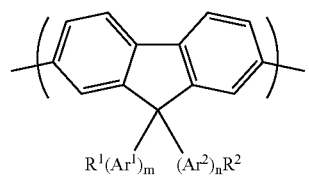

wherein
$R^1$ and $R^2$ are independently alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;

$Ar^1$ and $Ar^2$ are independently aryl or substituted aryl;

m and n are independently 0 or 1; and at least one of $R^1$ and $R^2$ is alkenyl, alkynyl, substituted alkenyl, or substituted alkynyl.

In particular embodiments, $R^2$ may be $C_{3-20}$ alkenyl, or $C_{3-20}$ alkynyl, or $C_{3-8}$ alkenyl, or $C_{4-8}$ alkynyl, or $R^1$ may be $C_3$-$C_8$ alkyl. In other embodiments, both $R^1$ and $R^2$ may be $C_{3-20}$ alkynyl, or both $R^1$ and $R^2$ are $C_{4-8}$ alkynyl. For example, the polymer composition may include polyfluorenes containing one or more of the structural units below:

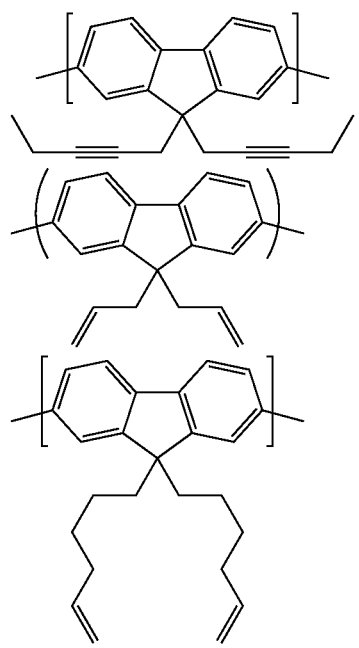

In another aspect, the present invention relates to compounds or monomers from which the structural units of formula I may be derived. The monomers are of formula

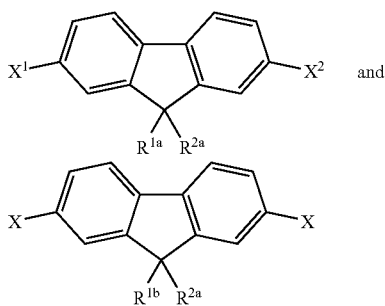

wherein
R$^{1a}$ and R$^{2a}$ are independently C$_{10-20}$ alkenyl, C$_{3-20}$ alkynyl, C$_{3-20}$ substituted alkenyl, C$_{3-20}$ substituted alkynyl, or a combination thereof; R$^{1b}$ is alkyl, substituted alkyl, or a combination thereof; and
X$^1$ and X$^2$ are independently halogen, sulfonate, boronic acid or an ester of boronic acid.

In particular, R$^{1a}$ and R$^{2a}$ may be C$_{3-20}$ alkynyl, or C$_{4-8}$ alkynyl.

Exemplary monomers according to the present invention include

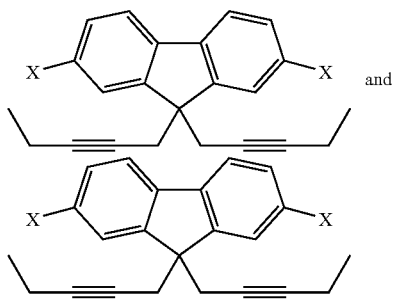

Preferred substituents for R$^{2a}$ include C$_{3-20}$ alkenyl, C$_{3-20}$ alkynyl, C$_{3-8}$ alkenyl, and C$_{4-8}$ alkynyl. Preferred substituents for R$^{1b}$ are C$_3$-C$_8$ alkyl.

In another aspect, the present invention relates to polymers comprising structural units of formula

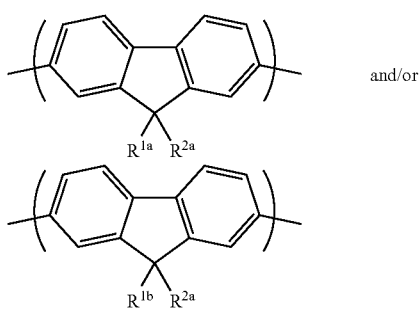

wherein R$^{1a}$, R$^{1b}$ and R$^{2a}$ are as defined above.

Exemplary polymers according to the present invention include structural units of formula

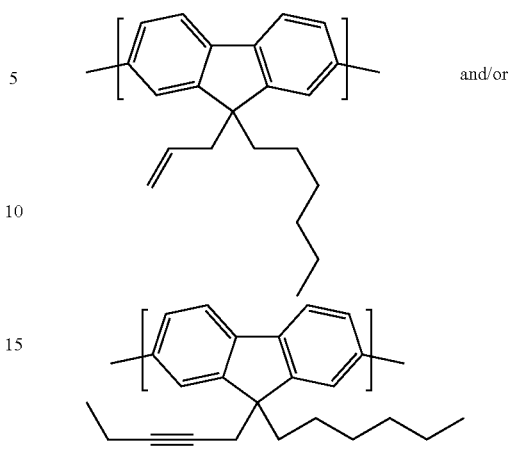

Polyfluorenes for use in the polymer compositions of the present invention may include structural units in addition to those of formula I, such as unsubstituted fluorenyl units and/or fluorenyl units substituted with saturated groups such as alkyl. Other structural units may be derived from conjugated compounds as described in U.S. Pat. No. 6,900,285. In particular, structural units derived from tertiary aromatic amines may be used. The amount of structural units derived from unsaturated monomers ranges from about 0.05 mol % to about 50 mol %, particularly from about 1 mol % to about 25 mol %, and more particularly from about 1 mol % to about 10 mol %.

The polyfluorenes may be prepared by methods known in the art for making polyfluorenes, including Suzuki coupling of the appropriate dihalide and diboronate/diboronic acid and Yamamoto coupling. U.S. Pat. Nos. 5,708,130; 6,169,163; 6,512,083; and 6,900,285 describe synthesis of polymers containing fluorene subunits.

Any siloxane substituted with at least two hydrogen atoms may be used. In many embodiments, more than two hydro substituents are present. In particular, the hydrosiloxane may include structural units of formula

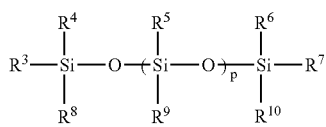

wherein
R$^3$, R$^4$, R$^5$, R$^6$, R$^7$, R$^8$, R$^9$, and R$^{10}$ are independently H, C$_1$-C$_{10}$ alkyl, phenyl or

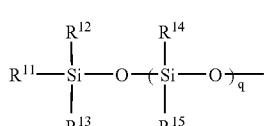

p and q are independently 0 or an integer from 1 to 100; and at least two of R$^3$, R$^4$, R$^5$, R$^6$, R$^7$, R$^8$, R$^9$, and R$^{10}$ are H.

In various embodiments, n is an integer from 1 to 20, or R$^3$ and R$^7$, and/or R$^5$ are H, or R$^9$ is phenyl; or R$^4$, R$^6$, R$^8$, and R$^{10}$ are methyl. Exemplary hydrosiloxanes that may be used in the polymer compositions of the present invention include hydride terminated methylhydrosiloxane-phenymethylsiloxane copolymers, hydride terminated polydimethylsiloxanes, methyl hydrosiloxane-dimethylsiloxane copolymers, polymethyl hydrosiloxanes, polyethylhydrosiloxanes, hydride terminated polyphenyl-(dimethylhydrosiloxy)siloxanes, hydride terminated methyl hydrosiloxane-phenymethylsiloxane copolymers, methylhydrosiloxane-octylmethylsiloxane copolymers, and hydride Q resins.

Vinyl siloxanes may be used in addition to the polyfluorenes and hydrosiloxanes in the polymer compositions of the present invention, if desired. Exemplary vinylsiloxanes that may be used in the polymer compositions of the present invention include vinyl terminated polydimethylsiloxanes, vinyl terminated diphenylsiloxane-dimethylsiloxanes, vinyl terminated polyphenyl methylsiloxanes, vinyl terminated trifluoropropylmethylsiloxane-dimethylsiloxanes, vinyl terminated diethylsiloxane-dimethylsiloxanes, trimethoxysiloxy terminated vinylmethylsiloxane-dimethylsiloxane copolymers, vinyl terminated vinylmethylsiloxane-dimethylsiloxane copolymers, vinyl Q resins and vinyl T-structure polymers.

Molecular weight of the hydrosiloxane and the vinylsiloxane is not critical, and typically ranges from about 200 to about 200,000 Daltons. The total amount of siloxane used ranges from about 1-50% by weight relative to the polyfluorene, and depends on the mol % of hydride in the hydrosiloxane, mol % of structural units derived from unsaturated monomers in the polymer, the amount of polymer in the composition, and, where a vinylsiloxane is used, on the mol % of vinyl groups in vinylsiloxane and the amount of vinylsiloxane in the composition. The stoichiometry ranges from less than about 1 moles of hydride to about 1 mole total unsaturation, that is including unsaturation in the polymer and in any vinylsiloxane, up to about 4.5 moles of hydride to about 1 mole unsaturation, and particularly from about 1.3 moles of hydride to about 1 mole unsaturation. Catalysts for the hydrosilation reaction include platinum complexes.

In yet another aspect, the present invention relates to opto-electronic devices comprising a polymer composition according to the present invention as at least part of an organic electroluminescent layer.

An opto-electronic device, exemplified by an organic light emitting device, typically comprises multiple layers which include, in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay. An opto-electronic device according to the present invention includes an organic electroluminescent layer composed of the polymer composition of the present invention.

Other components which may be present in an organic light-emitting device in addition to the anode, cathode and light emitting material include hole injection layers, electron injection layers, and electron transport layers. The electron transport layer need not be in contact with the cathode, and frequently the electron transport layer is not an efficient hole transporter and thus it serves to block holes migrating toward the cathode. During operation of an organic light-emitting device comprising an electron transport layer, the majority of charge carriers (i.e. holes and electrons) present in the electron transport layer are electrons and light emission can occur through recombination of holes and electrons present in the electron transport layer. Additional components which may be present in an organic light-emitting device include hole transport layers, hole transporting emission (emitting) layers and electron transporting emission (emitting) layers.

The organic electroluminescent layer is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transport layer is a layer which facilitates conduction of electrons from cathode to a charge recombination site. The electron transport layer need not be in contact with the cathode, and frequently the electron transport layer is not an efficient hole transporter and thus it serves to block holes migrating toward the cathode. During operation of an organic light emitting device comprising an electron transport layer, the majority of charge carriers (i.e. holes and electrons) present in the electron transport layer are electrons and light emission can occur through recombination of holes and electrons present in the electron transport layer. A hole transport layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. A electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square, as measured by a four-point probe technique. Indium tin oxide (ITO) is frequently used as the anode because it is substantially transparent to light transmission and thus facilitates the escape of light emitted from electro-active organic layer. Other materials which may be utilized as the anode layer include tin oxide, indium oxide, zinc oxide, indium zinc oxide, zinc indium tin oxide, antimony oxide, and mixtures thereof.

Materials suitable for use as the cathode include zero valent metals which can inject negative charge carriers (electrons) into the inner layer(s) of the OLED. Various zero valent metals suitable for use as the cathode 20 include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

Materials suitable for use in hole injection layers include 3,4-ethylenedioxythiophene (PEDOT) and blends of PEDOT with polystyrene sulfonate (PSS), commercially available from H.C. Stark, Inc. under the BAYTRON® tradename, and polymers based on the thieno[3,4b]thiophene (TT) monomer, commercially available from Air Products Corporation.

Materials suitable for use in hole transporting layers include 1,1-bis((di-4-tolylamino) phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis(4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use as the electron transport layer include poly(9,9-dioctyl fluorene), tris(8-hydroxyquinolato)aluminum($Alq_3$), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials suitable for use in the light emitting layer include electroluminescent polymers such as poly(9,9-dioctyl fluorene) and copolymers thereof, such as F8-TFB.

DEFINITIONS

In the context of the present invention, alkyl is intended to include linear, branched, or cyclic hydrocarbon structures and combinations thereof, including lower alkyl and higher alkyl. Preferred alkyl groups are those of $C_{20}$ or below. Lower alkyl refers to alkyl groups of from 1 to 6 carbon atoms, preferably from 1 to 4 carbon atoms, and includes methyl, ethyl, n-propyl, isopropyl, and n-, s- and t-butyl. Higher alkyl refers to alkyl groups having seven or more carbon atoms, preferably 7-20 carbon atoms, and includes n-, s- and t-heptyl, octyl, and dodecyl. Cycloalkyl is a subset of alkyl and includes cyclic hydrocarbon groups of from 3 to 8 carbon atoms. Examples of cycloalkyl groups include cyclopropyl, cyclobutyl, cyclopentyl, and norbornyl Aryl and heteroaryl mean a 5- or 6-membered aromatic or heteroaromatic ring containing 0-3 heteroatoms selected from nitrogen, oxygen or sulfur; a bicyclic 9- or 10-membered aromatic or heteroaromatic ring system containing 0-3 heteroatoms selected from nitrogen, oxygen or sulfur; or a tricyclic 13- or 14-membered aromatic or heteroaromatic ring system containing 0-3 heteroatoms selected from nitrogen, oxygen or sulfur. The aromatic 6- to 14-membered carbocyclic rings include, for example, benzene, naphthalene, indane, tetralin, and fluorene; and the 5- to 10-membered aromatic heterocyclic rings include, e.g., imidazole, pyridine, indole, thiophene, benzopyranone, thiazole, furan, benzimidazole, quinoline, isoquinoline, quinoxaline, pyrimidine, pyrazine, tetrazole and pyrazole.

Arylalkyl means an alkyl residue attached to an aryl ring. Examples are benzyl and phenethyl. Heteroarylalkyl means an alkyl residue attached to a heteroaryl ring. Examples include pyridinylmethyl and pyrimidinylethyl. Alkylaryl means an aryl residue having one or more alkyl groups attached thereto. Examples are tolyl and mesityl.

Alkoxy or alkoxyl refers to groups of from 1 to 8 carbon atoms of a straight, branched, or cyclic configuration attached to the parent structure through an oxygen. Examples include methoxy, ethoxy, propoxy, isopropoxy, cyclopropyloxy, and cyclohexyloxy. Lower alkoxy refers to groups containing one to four carbons. Alkenoxy, alkenyloxy, alkynoxy or alkynyloxy refers to groups of from 2 to 20 carbon atoms of a straight, branched, or cyclic configuration that include at least one double bond (for alkenoxy) or triple bond (for alkynoxy) and are attached to the parent structure through an oxygen. Examples include vinyloxy, propenoxy(allyloxy), hexenoxy, pentynoxy, and cyclohexenoxy.

Acyl refers to groups of from 1 to 8 carbon atoms of a straight, branched, cyclic configuration, saturated, unsaturated and aromatic and combinations thereof, attached to the parent structure through a carbonyl functionality. One or more carbons in the acyl residue may be replaced by nitrogen, oxygen or sulfur as long as the point of attachment to the parent remains at the carbonyl. Examples include acetyl, benzoyl, propionyl, isobutyryl, t-butoxycarbonyl, and benzyloxycarbonyl. Lower-acyl refers to groups containing one to four carbons.

Heterocycle means a cycloalkyl or aryl residue in which one to two of the carbons is replaced by a heteroatom such as oxygen, nitrogen or sulfur. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, and tetrahydrofuran.

Substituted refers to residues, including, but not limited to, alkyl, alkylaryl, aryl, arylalkyl, and heteroaryl, wherein up to three H atoms of the residue are replaced with lower alkyl, substituted alkyl, aryl, substituted aryl, haloalkyl, alkoxy, carbonyl, carboxy, carboxalkoxy, carboxamido, acyloxy, amidino, nitro, halo, hydroxy, $OCH(COOH)_2$, cyano, primary amino, secondary amino, acylamino, alkylthio, sulfoxide, sulfone, phenyl, benzyl, phenoxy, benzyloxy, heteroaryl, or heteroaryloxy.

Haloalkyl refers to an alkyl residue, wherein one or more H atoms are replaced by halogen atoms; the term haloalkyl includes perhaloalkyl. Examples of haloalkyl groups that fall within the scope of the invention include $CH_2F$, $CHF_2$, and $CF_3$.

Many of the compounds described herein may contain one or more asymmetric centers and may thus give rise to enantiomers, diastereomers, and other stereoisomeric forms that may be defined, in terms of absolute stereochemistry, as (R)- or (S)-. The present invention is meant to include all such possible isomers, as well as, their racemic and optically pure forms. Optically active (R)- and (S)-isomers may be prepared using chiral synthons or chiral reagents, or resolved using conventional techniques. When the compounds described herein contain olefinic double bonds or other centers of geometric asymmetry, and unless specified otherwise, it is intended that the compounds include both E and Z geometric isomers. Likewise, all tautomeric forms are also intended to be included.

Oxaalkyl refers to an alkyl residue in which one or more carbons have been replaced by oxygen. It is attached to the parent structure through an alkyl residue. Examples include methoxypropoxy, 3,6,9-trioxadecyl and the like. The term oxaalkyl is intended as it is understood in the art, i.e. it refers to compounds in which the oxygen is bonded via a single bond to its adjacent atoms (forming ether bonds); it does not refer to doubly bonded oxygen, as would be found in carbonyl groups. Similarly, thiaalkyl and azaalkyl refer to alkyl residues in which one or more carbons has been replaced by sulfur or nitrogen, respectively. Examples include ethylaminoethyl and methylthiopropyl.

EXAMPLES

General Approach

To prepare copolymers of polyfluorenes with cross-linkable groups, a balance was struck between two factors. One approach is to prepare so-called F6-F or F8-F copolymers where F6 or F8 are di-hexyl or di-octyl fluorenyl units and F is a 9,9-un-substituted fluorenyl unit. Preparation of the desired copolymer from a mixture of 2,7-di-bromo and 2,7-di-boronic ester precursors via Pd-catalyzed Suzuki coupling resulted in lower molecular weight and lower yield co-polymers as the proportion of the unsubstituted F unit increased above about 50%.

An alternative strategy used was to co-polymerize the appropriate 9,9-substituted monomers where possible. In some cases, where proportion of the alkynyl-substituted fluorene unit exceeded 5-10%, alkynyl-substituted monomers inhibited the Pd-catalyzed Suzuki reaction.

The $(F6)_{3.0}(F)_{1.0}$ copolymer precursor was prepared via Suzuki coupling and then subsequently reacted with a mixture of excess either hexylbromide/1-bromo-2-pentyne or a mixture of hexylbromide/allyl-bromide. Excess of R—Br relative to 9-hydrogens is desirable to get good conversion. The use of mixed alkyl-bromide with unsaturated bromide (allyl or alkyne) leads to final product with a distribution of saturated/unsaturated units on the 9-position (Scheme 1).

SCHEME 1

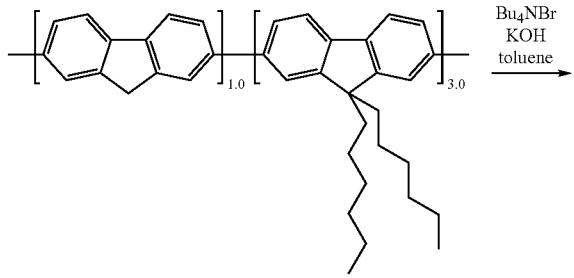

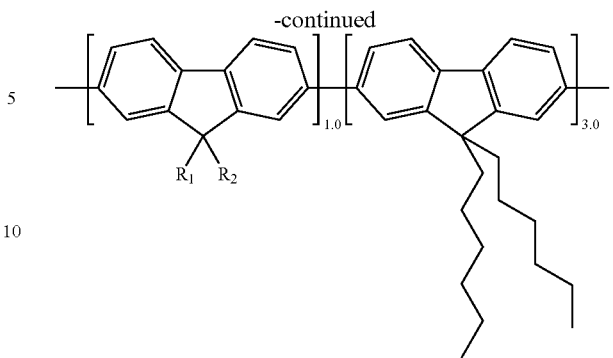

EXAMPLE 1: Synthesis of $(F6)_{3.0}(F)_{1.0}$

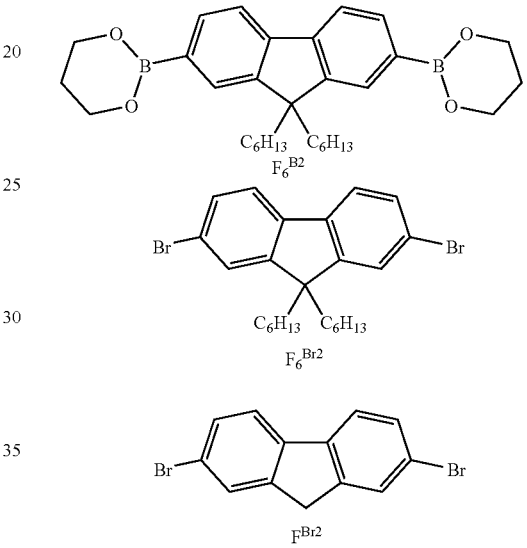

$F6^{B2}$ and $F^{Br2}$ were obtained from Aldrich and purified by recrystallization from acetonitrile. $F6^{B2}$ was prepared from F6-bis-boronic acid and ethylene glycol. The product was purified by recrystallization from acetonitrile. $F6^{B2}$ (2.5 g, 4.98 mmol), $F^{Br2}$ (0.81 g, 2.5 mmol) and $F6^{Br2}$ (1.23 g, 2.5 mmol) were combined with toluene (75 mL) under argon and then combined with stirring with $K_2CO_3$ (2.75 g, 20 mmol) and water (10 mL). After ca. 10 min, the catalyst ligand mixture was added composed of $Pd(acetate)_2$ (0.030 g, 0.13 mmol) and tri-p-tolyl-phosphine (0.14 g, 0.46 mmol). The mixture was subjected to reflux overnight and then after cooling, the contents were filtered through a plug composed of roughly equal parts Celite, Drierite and 3-(diethylenetiramino)propyl-functionalized silica. The volatiles were removed in vacuo and then the residue was dissolved in toluene. A solid was precipitated with methanol; the toluene-insoluble fraction was dissolved in $CH_2Cl_2$ and precipitated into methanol.

|  | Grams | Mn | Mw |
|---|---|---|---|
| Toluene-soluble | 0.69 | 15,500 | 55,300 |
| $CH_2Cl_2$-soluble | 0.40 | 16,900 | 68,000 |

Example 2

Synthesis of (F6)$_{3.0}$(FR1R2)$_{1.0}$, R1=Allyl, R2=Hexyl, Moles of R1=R2

(F6)$_{3.0}$(F)$_{1.0}$ (0.15 g, 0.13 mmol) was combined with hexyl bromide (0.21 g, 1.27 mmol) and allyl bromide (0.16 g, 1.32 mmol) in toluene (10 mL), Bu$_4$NBr (0.01 g) and 50% NaOH

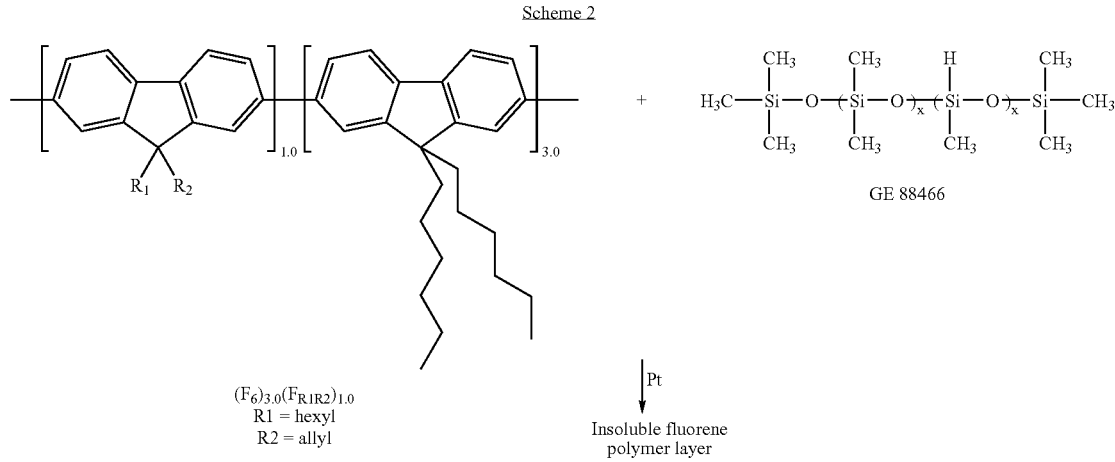

Scheme 2

(F6)$_{3.0}$(F$_{R1R2}$)$_{1.0}$
R1 = hexyl
R2 = allyl

Insoluble fluorene polymer layer (aq, 10 mL). The contents were subjected to reflux for 3 days. The aqueous layer was removed by pipette and then the top toluene layer was subjected to two 10 mL water extractions and then the toluene-solubles were poured into methanol to obtain a solid that was filtered and washed with methanol; 0.080 g obtained. $^1$H NMR showed that the 9-hydrogens in (F6)$_{3.0}$(F)$_{1.0}$ were consumed and that peaks due to allyl were present.

Example 3

Synthesis of (F6)$_{3.0}$(FR1R2)$_{1.0}$, R1=Allyl, R2=Hexyl, Moles of R1=2R2

(F6)$_{3.0}$(F)$_{1.0}$ (0.1 g, 0.086 mmol) was combined with hexyl bromide (0.19 g, 0.0012) and allyl bromide (0.069 g, 0.57 mmol) in toluene (10 mL) and then Bu$_4$NBr (0.01 g) was added with 50% NaOH (aq, 10 mL). The contents were subjected to reflux for 2 days under argon. After cooling the organic layer was extracted with water and then HCl (aq) and water. The toluene soluble layer was poured into methanol to obtain a precipitate that was dried in vacuo, 0.11 g.

Example 4

Synthesis of (F6)$_{3.0}$(FR1R2)$_{1.0}$, R1=Pentynyl, R2=Hexyl (F6)$_{3.0}$(F)$_{1.0}$ (0.24 g, 0.2 mmol) was combined with hexyl bromide (0.33 g, 2.0 mmol) and 1-bromo-2-pentyne (0.29 g, 1.99 mmol) in toluene (10 mL), Bu$_4$NBr (0.01 g) and 50% NaOH (aq, 10 mL). The contents were subjected to reflux for 3 days. The aqueous layer was removed by pipette and then the top toluene layer was subjected to two 10 mL water extractions and then the toluene-solubles were poured into methanol to obtain a solid that was filtered and washed with methanol; 0.010 g obtained. $^1$H NMR showed the disappearance of the 9-H resonance.

Example 5

Insoluble Layer Via Hydrosilylation with Dimethylsiloxy-Methylhydrogen-Siloxane Copolymer Stock solutions of (F6)$_{3.0}$(F$_{R1R2}$)$_{1.0}$, R1=allyl, R2=hexyl, moles of R1=2R2 were prepared (10 mg) in 1 mL of xylenes. Four samples were prepared on one-inch glass slides. For the first sample, the stock solution was spun on glass at 3000 rpm. For the second sample, the stock solution was spun on glass, as for the first sample. Both were baked at 140° C. for 15 minutes. Then the xylene solvent was spun on the second sample. Black light analysis clearly showed removal of polymer in the second sample, as compared to the first sample. For the third and fourth samples, a stock solution containing the same amount of the fluorene polymer in the same amount of xylenes, and 2 drops (ca. 0.1 g) of GE Silicones 88466, 1:1 copolymer of dimethyl siloxane methylhydrogen siloxane, was added along with 1 drop of a 0.15% platinum by weight solution of GE Silicones 88346 (Pt-tetramethyltetravinyltetrasiloxane complex in xylenes). A third sample was prepared by spinning on the solution on a glass slide and baking as for the first and second samples. The fourth sample was like the third, except that the xylene solvent was spun on after the baking step. Results are shown in Table 3.

TABLE 3

| | UV-Vis Measurements | |
|---|---|---|
| Sample No. | Optical Density (OD) | relative quantum efficiency (QE) |
| 1 | 0.482 | 0.91 |
| 2 | 0.18 | 0.9 |
| 3 | 0.51 | 0.96 |
| 4 | 0.53 | 1 |

Optical measurements showed that samples 1, 3 and 4 were photophysically identical; sample 2 had about 60% loss. The variation between samples 1, 3 and 4 was probably due to their physical in-homogeneity rather than detected differences in QE or OD.

Example 6

Synthesis of $(F8)_{0.95}F_{0.05}$ $F6^{B2}$ (2.5 g, 5 mmol), $F6^{Br2}$ (2.2 g, 4.5 mmol) and $F^{Br2}$ (0.16 g, 0.5 mmol) were combined with toluene (75 mL) and Pd(acetate)$_2$ (33 mg, 0.15 mmol), tri-o-tolyl-phosphine (0.16 g, 0.53 mmol). The solution was stirred under argon and then Et$_4$NOH (18.4 mL of a 20% solution) and water (18 mL) was added with stirring and heating for 24 h. The solution was extracted with water, 10% HCl, water, saturated NaCl and water. The toluene-solubles were stirred with Celite, Drierite and 3(diethyltriamino)propyl-functionalized silica and then filtered. The volatiles were removed in vacuo to obtain 4.48 g crude polymer, Mn=12,800, Mw=37,900. The polymer was twice re-precipitated with toluene and methanol to obtain a solid with Mn=11,300 and Mw=28,500. $^1$H NMR integration of the 9-H protons of the F unit vs. the first methylene units of the F8 group show a mole ratio of these units of 4:96.

Example 7

Synthesis of (F8)(F) via Yamamoto Coupling

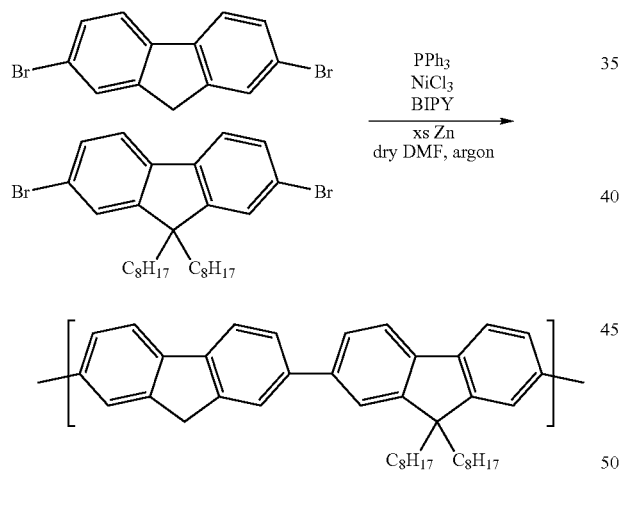

The following components of the Yamamoto catalyst (H. Q. Zhang, Thin Solid Films, 477 (2005) 119) were combined: zinc powder (0.7 g, 11 mmol), triphenyl phosphine (0.75 g, 2.86 mmol), 2,2'-bipyridine (0.056 g, 0.36 mmol) and NiCl$_2$ (0.046 g, 0.36 mmol) in dimethylformamide (dmf, 25 mL) and degassed under argon. Then the monomers $F_8^{Br2}$ (1 g, 1.82 mmol) and $F^{Br2}$ (0.91 g, 1.82 mmol) were combined and the mixture was subjected to heating at 100° C. with stirring under argon for 17 h. THF was added to the mixture (some losses) and the contents filtered to remove catalyst. The filtrate was poured into methanol to give a green solid product. The product was re-precipitated with CH$_2$Cl$_2$ and methanol. $^1$H NMR analysis showed that the ratio of F to F8 was about 1:1.2.

Example 8

Preparation of 2,7-dibromo-9,9-dihex-5-enyl-fluorene 2,7-dibromofluorene (5 g, 15.4 mmol) was combined with 1-bromo-5-hexene (7.5 g, 46.0 mmol) in toluene (50 mL), NaOH (50 mL, 50%, aq) and Bu$_4$NBr (0.1 g) as a phase transfer catalyst. The mixture was heated at ca. 100° C. with stirring for 5 h. The organic layer was separated from the aqueous layer and then treated with 10% HCl and then water and then stirred the MgSO$_4$ and carbon black. The solution was filtered and all solvents were removed in vacuo to give a brown oil, 7.83 g.

Example 9

Preparation of 2,7-dibromo-9,9-diallyl-fluorene 2,7-dibromofluorene (5 g, 15.4 mmol) was combined with allyl bromide (5.6 g, 46.2 mmol) and reacted with toluene, NaOH and Bu$_4$NBr as above for 2,7-dibromo-9,9-dihex-5-enyl-fluorene. 7.1 g of a yellow solid was obtained.

Example 10

Preparation of Copolymer of Di-Hexylfluorene-Dihexenylfluorene and Diallylfluorene

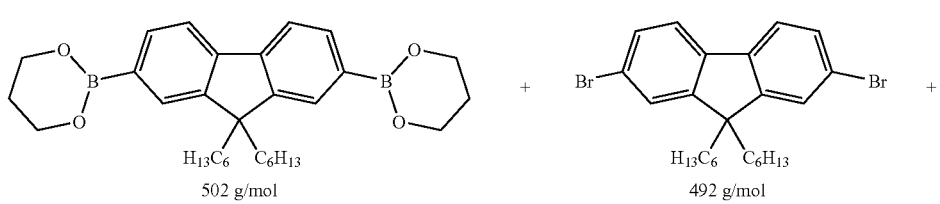

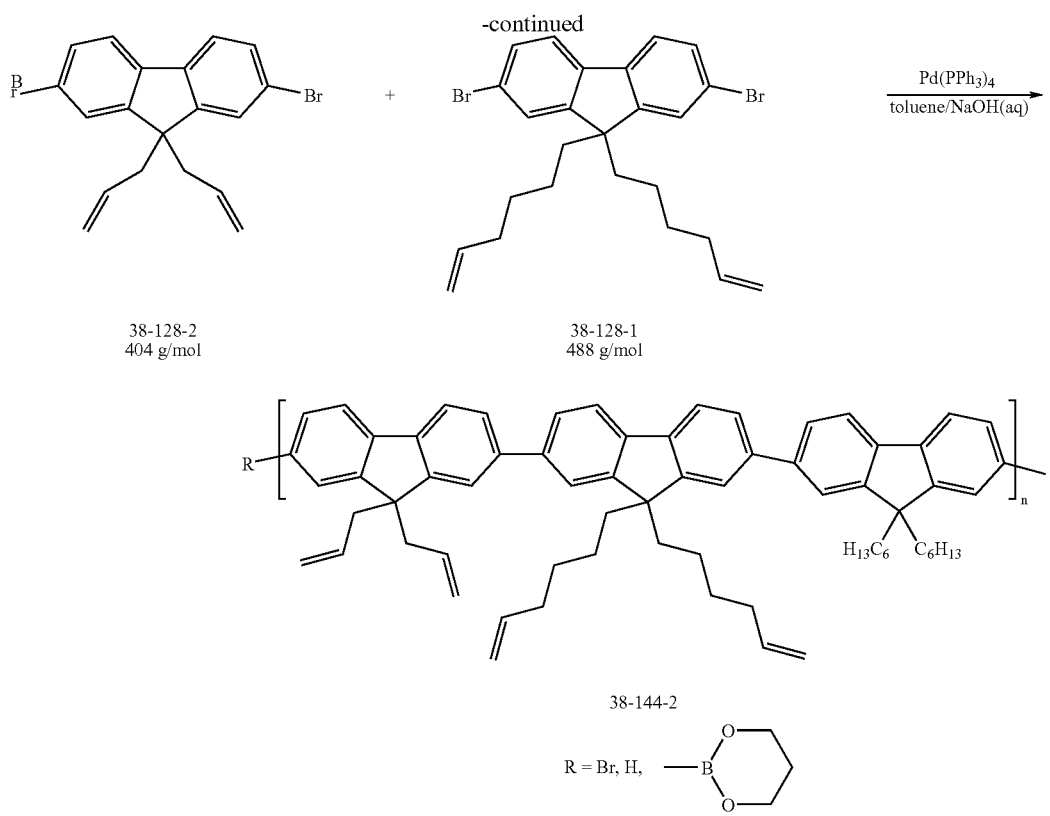

38-128-2
404 g/mol 38-128-1
488 g/mol 38-144-2

R = Br, H, 2,7-Ethyleneglycolateboronic ester-9,9-dihexylfluorene (2.5 g, 5 mmol), 2,7-dibromo-9,9-di-hex-5-enyl-fluorene (0.3 g, 0.61 mmol), 2,7-dibromo-9,9-diallyl-fluorene (0.7 g, 1.74 mmol) and 2,7-dibromo-9,9-hexyl-fluorene (1.23 g, 2.5 mmol) were combined in toluene (75 mL), Pd(PPh$_3$)$_4$ (140 mg) and Et$_4$NOH (25%, 10 mL). The mixture was heated with stirring at 80° C. for 24 h. The mixture was filtered through a 1:1:1 (w/w/w) mixture of Celite, Drierite and 3(diethyltriamine)propyl-functionalized silica. The filtrate was taken to dryness in vacuo and then dissolved in a minimum of toluene. The toluene solution was poured into methanol to obtain a orange solid which was collected by filtration and washed with methanol. The obtained solid was re-precipitated to obtain 2.14 g of solid, gpc Mw=35,000. Mn=10,600.

Example 11

Hydrosilylation of 9,9-Dialkynyl Fluorene Copolymer and 9,9-Dialkenyl Fluorene Copolymer Platinum Irgafos Complex: Platinum Karstedt catalyst (complex of Pt$^0$ with divinyltetramethyldisiloxane, 5% Pt in xylenes, 0.25 g, 1.28 mmol Pt), vinyl-stopped polydimethylsiloxane (GE 88934, 3.3 g) and Irgafos 168 (tris-(2,4-di-t-butylphenyl) phosphate, Ciba Geigy; 3.31 g, 5.12 mmol) were combined with toluene (50 mL) and refluxed overnight. The volatiles were then removed in vacuo to give 6.76 g of a white oil, estimated 3.7% Pt. A stock solution of the Pt Irgafos catalyst was prepared with 0.135 g in xylenes (50 mL volumetric flask); 0.1 mg Pt/mL.

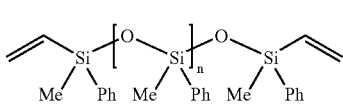

PMV-9925

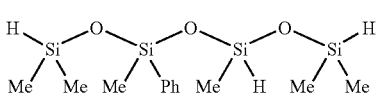

HPM-502

A stock solution was prepared containing PMV 9925 (Gelest; 20 g) and HPM 502 (Gelest; 2.8 g).

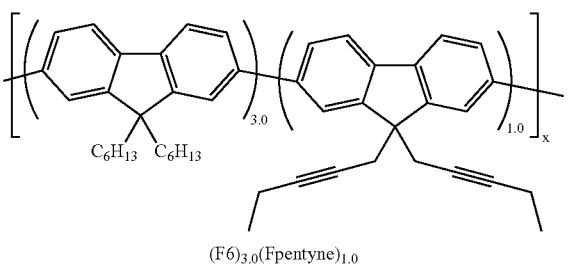

(F6)$_{3.0}$(Fpentyne)$_{1.0}$

-continued

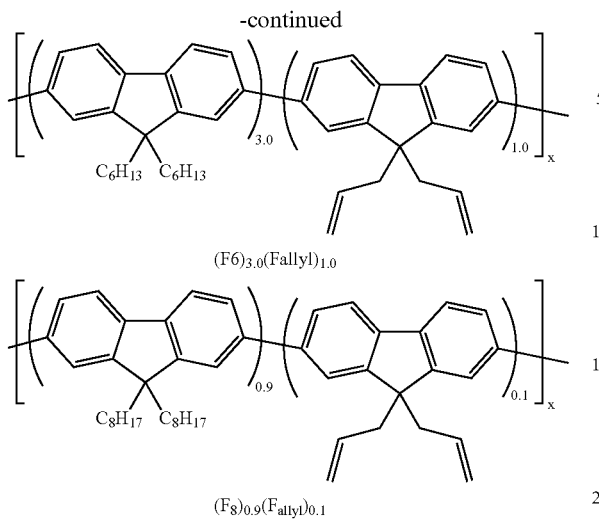

(F6)$_{3.0}$(Fallyl)$_{1.0}$ (F8)$_{0.9}$(F$_{allyl}$)$_{0.1}$

The PMV/HPM stock solution (1 g) and the Pt Irgafos catalyst (10 uL) were combined with (F6)$_{3.0}$(Fpentyne)$_{1.0}$ fluorene copolymer (20.7 mg). No gel formed upon heating in deuterated benzene. The experiment was repeated except that (F6)$_{3.0}$(F$_{allyl}$)$_{1.0}$ (19.5 mg) was heated in deuterated benzene and gelled, insoluble in benzene after heating. The experiment was repeated except that (F8)$_{0.9}$(F$_{allyl}$)$_{1.0}$, (15.1 mg) was combined with the stock solution and heated in deuterated benzene to give an insoluble gel. 1H NMR analysis confirmed that vinyl was consumed in the solutions containing gelled polymers.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A crosslinked insoluble polymer product derived from reaction between a hydrosiloxane and a polyfluorene comprising structural units of formula I

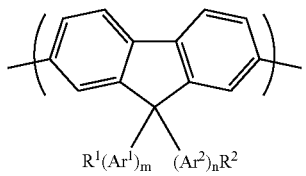

I wherein
R$^1$ and R$^2$ are independently alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;
Ar$^1$ and Ar$^2$ are independently aryl or substituted aryl;
m and n are independently 0 or 1; and
at least one of R$^1$ and R$^2$ is alkenyl, alkynyl, substituted alkenyl, or substituted alkynyl.

2. A polymer composition according to claim 1 wherein the precursor hydrosiloxane comprised structural units of formula

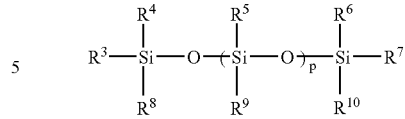

wherein
R$^3$, R$^4$, R$^5$, R$^6$, R$^7$, R$^8$, R$^9$, and R$^{10}$ are independently H, C$_1$-C$_{10}$ alkyl, phenyl or

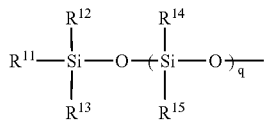

p and q are independently 0 or an integer from 1 to 100; and
at least two of R$^3$, R$^4$, R$^5$, R$^6$, R$^7$, R$^8$, R$^9$, R$^{10}$, R$^{11}$, R$^{12}$, R$^{13}$, R$^{14}$, and R$^{15}$ are H.

3. A polymer product according to claim 2, wherein p is an integer from 1 to 20.

4. A polymer product according to claim 2, wherein R$^3$ and R$^7$ are H.

5. A polymer product according to claim 2, wherein R$^5$ is H.

6. A polymer product according to claim 2, wherein R$^9$ is phenyl.

7. A polymer product according to claim 2, wherein R$^4$, R$^6$, R$^8$, and R$^{10}$ are methyl.

8. A polymer product according to claim 1, derived from reaction between the hydrosiloxane, the polyfluorene comprising structural units of formula I, and a vinylsiloxane.

9. A polymer product according to claim 1, wherein R$^2$ is C$_{3-20}$ alkenyl.

10. A polymer product according to claim 1, wherein R$^2$ is C$_{3-20}$ alkynyl.

11. A polymer product according to claim 1, wherein R$^2$ is C$_{3-8}$ alkenyl.

12. A polymer product according to claim 1, wherein R$^2$ is C$_{4-8}$ alkynyl.

13. A polymer product according to claim 1, wherein R$^1$ is C$_3$-C$_8$ alkyl.

14. A polymer product according to claim 1, wherein R$^1$ and R$^2$ are C$_{3-20}$ alkynyl.

15. A polymer product according to claim 1, wherein R$^1$ and R$^2$ are C$_{4-8}$ alkynyl.

16. A polymer product according to claim 1, wherein the precursor polyfluorene comprised structural units of formula

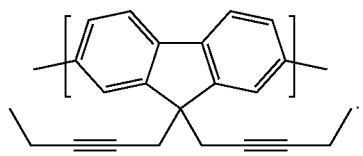

17. A polymer product according to claim 1, wherein the precursor polyfluorene comprised structural units of formula

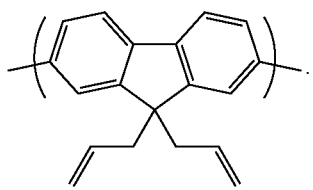

18. A polymer product according to claim 1, wherein the precursor polyfluorene comprised structural units of formula

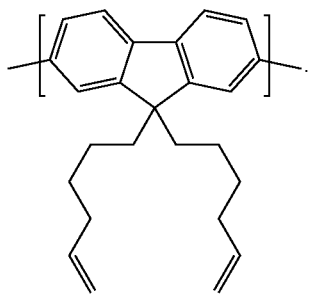

19. A polymer product according to claim 18, wherein the precursor polyfluorene additionally comprised structural units of formula

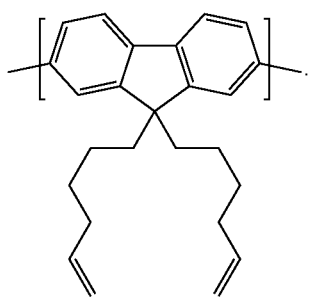

20. A crosslinked insoluble polymer product derived from reaction between a hydrosiloxane and a polyfluorene comprising structural units of formula

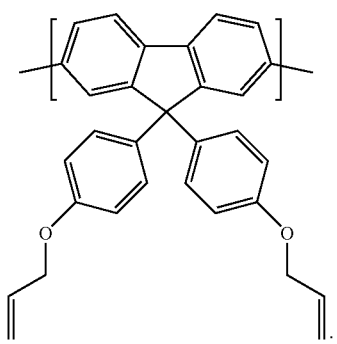

21. A polymer product according to claim 20, wherein the precursor polyfluorene comprised structural units of formula

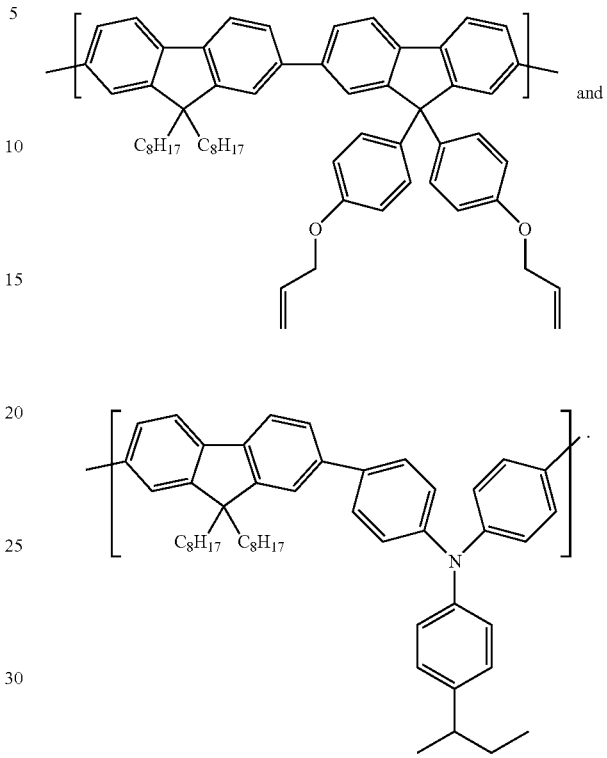

22. An optoelectronic device comprising a crosslinked insoluble polymer product derived from reaction between a hydrosiloxane and a polyfluorene comprising structural units of formula I

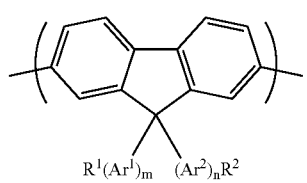

wherein
$R^1$ and $R^2$ are independently alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;
$Ar^1$ and $Ar^2$ are independently aryl or substituted aryl;
m and n are independently 0 or 1; and
at least one of $R^1$ and $R^2$ is alkenyl, alkynyl, substituted alkenyl, or substituted alkynyl.

* * * * *